United States Patent
Chen et al.

(10) Patent No.: US 11,682,621 B2
(45) Date of Patent: Jun. 20, 2023

(54) CONNECTOR FOR IMPLEMENTING MULTI-FACETED INTERCONNECTION

(71) Applicant: Zhuhai ACCESS Semiconductor Co., Ltd, Guangdong (CN)

(72) Inventors: Xianming Chen, Guangdong (CN); Lei Feng, Guangdong (CN); Benxia Huang, Guangdong (CN); Yejie Hong, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 0 days.

(21) Appl. No.: 17/463,736

(22) Filed: Sep. 1, 2021

(65) Prior Publication Data

US 2022/0068825 A1    Mar. 3, 2022

(30) Foreign Application Priority Data

Sep. 2, 2020    (CN) .......................... 202010911278.X (51) Int. Cl.
*H01L 23/532* (2006.01)
*H01L 23/538* (2006.01)
*H01L 23/00* (2006.01)

(52) U.S. Cl.
CPC .... *H01L 23/53228* (2013.01); *H01L 23/5386* (2013.01); *H01L 24/14* (2013.01)

(58) Field of Classification Search
CPC .......................... H01L 23/53228; H01L 24/14
USPC ....................................................... 257/737
See application file for complete search history.

(56) References Cited

U.S. PATENT DOCUMENTS

2014/0054079 A1*  2/2014  Shen .................... H05K 3/4611
                                                        174/262

* cited by examiner

*Primary Examiner* — Quoc D Hoang
(74) *Attorney, Agent, or Firm* — The PL Law Group, PLLC (57) ABSTRACT

A connector for implementing multi-faceted interconnection according to an embodiment of the present disclosure includes a first dielectric layer between a first circuit layer and a second circuit layer, a first copper pillar layer connecting the first circuit layer and the second circuit layer in the first dielectric layer, a second dielectric layer on the first circuit layer, a third circuit layer on the second dielectric layer, and a vertical second copper pillar layer connected to the third circuit layer, wherein an opening is formed in the second dielectric layer to expose the first circuit layer, and the second copper pillar layer exposes side faces facing side end faces of the first dielectric layer and the second dielectric layer.

6 Claims, 11 Drawing Sheets

CONNECTOR FOR IMPLEMENTING MULTI-FACETED INTERCONNECTION

CROSS-REFERENCE TO RELATED APPLICATION

This application claims the benefit under 35 USC § 119(a) of Chinese Patent Application No. 202010911278.X, filed on Sep. 2, 2020, in the China Intellectual Property Office, the entire disclosure of which is incorporated herein by reference for all purposes.

BACKGROUND

1. Technical Field

The invention relates to an electronic device packaging structure, in particular to a connector structure of a multi-faceted interconnection which plays a connecting role in a semiconductor package and a manufacturing method thereof.

2. Background of the Invention

With the development of industry, people expect more and more diversified functions as well as lighter, thinner and smaller properties of consumer electronic products, which requires the electronic products to be packaged denser, and packaged more thinner and smaller individually, and reduced size, in addition, poses great challenges to processes and devices. However, different packages in parallel are usually different in height, so there is still further reduced space for parallel devices and packages, and achieving side electrical connection between different devices and packages will provide a solution for package space utilization.

At present, a common method for increasing the density of a package body is to realize 3D stacking interconnection, such as connection by multilayer bonding wires after the chips are stacked, or multi-chip three-dimensional interconnection by a Through Silicon Via (TSV), and the packaged chips are connected with a printed circuit board (PCB) through a bearing plate. These are all conducted up and down in a "Z" direction, however, in an "X" direction and a "Y" direction, at present, only an internal electric connection exists, and a bearing plate electric connection between different devices and packages is not realized.

Only bonding wires can be used for realizing the electrical connection between different devices in the "X" and "Y" directions at present, however, the bonding wires are long, the electrical transmission path is long, the cost is high, and the bonding wires must be of a certain radian, which undoubtedly takes up vast available space.

Side conduction can directly realize a "face-to-face" or "back-to-back" electric connection between adjacent devices, which effectively shortens the transmission distance and the space utilization rate is high. The side ends are usually exposed by mechanical cutting, but the cutting accuracy of panel-level mechanical cutting is on the order of about a hundred microns and is generally not high. Even if a wafer-level cutting apparatus is used, single products will be produced by cutting since it is impossible to jump, and subsequent processes, such as the manufacture of protective layers of sidewalls and surfaces, cannot be completed. In addition, direct cutting on the metal might have been avoided in all electronic industries, which is mainly because overheating and spreading of the metal in the cutting process and cutting scraps of the metal cannot be avoided and removed, local overheating generated in the cutting process can lead to denaturation and carbonization of the insulating material, and most of the metal spreading and cutting scraps are embedded into the molten insulating material at the same time of denaturation, and embedding metal particles in the micron-scale distance range will directly short-circuit the product. In addition, the cutting blades are commonly made of high-speed steel, hard alloy materials, diamond and the like, the cutting blades are used for cutting copper metals, the abrasion to the blades is great, the abrasion amount is close to 10 times that of the traditional non-metal materials, and the processing cost is obviously increased.

Therefore, the prior art involving increasing package density has the following disadvantages:

1. stacking in the Z direction can only be adopted, and the space utilization rate is low;

2. electric connection in the X direction and the Y direction can only be realized via bonding wires, the cost is high, the transmission path of the electric signal is long, and the space utilization rate is low;

3. the port in the side face is exposed by a cutting method, the abrasion of the cutting metal to the cutting knife is large, and the processing cost is high; the high heat generated in the processing process can denature and carbonize the insulating material, meanwhile, the short circuit caused by the metal extension and the embedding of cutting chips into the molten insulating material can lead to failure of the product; in addition, cutting marks can be generated on the metal surface, and the roughness of the surface is on the order of about a hundred microns to millimeters, which is remarkably larger than the roughness of the etched surface.

Therefore, there is an urgent need for a connector capable of realizing multi-faceted interconnection and a manufacturing method thereof, so that different devices can be connected not only on the upper and lower surfaces, but also on the side faces, thereby improving the space utilization rate, shortening the electrical transmission path, and avoiding the problems caused by mechanical cutting.

SUMMARY

The embodiment of the invention aims to solve the technical problem, and provides a connector for implementing multi-faceted interconnection and a manufacturing method thereof. According to the invention, the multi-faceted interconnection is realized by exposing the metal side face through etching, so that the space utilization rate is improved, the electric transmission path is shortened, and the problem caused by mechanical cutting is avoided.

The invention relates to a connector for implementing multi-faceted interconnection, which comprises: a first dielectric layer between a first circuit layer and a second circuit layer; a first copper pillar layer connecting the first circuit layer and the second circuit layer in the first dielectric layer; a second dielectric layer on the first circuit layer; a third circuit layer on the second dielectric layer; and a vertical second copper pillar layer connected to the third circuit layer, wherein an opening is formed in the second dielectric layer to expose the first circuit layer, and the second copper pillar layer exposes side faces facing side end faces of the first dielectric layer and the second dielectric layer.

In some embodiments, the exposed side face of the second copper pillar layer is 13-30 microns lower than the side end faces of the first dielectric layer and the second dielectric layer, and this height difference can prevent a short circuit caused by solder during package soldering; if the connection is in direct insertion type, the height of the elastic sheet can also be used as the height of the elastic sheet so as to prevent the connection from dislocation and falling off.

In some embodiments, a third dielectric layer and a fourth circuit layer below the third dielectric layer are also formed below the second circuit layer, and an opening is formed in the third dielectric layer to expose the second circuit layer, thereby enabling upper and lower device stack interconnections and side electrical connections.

In some embodiments, a third copper pillar layer connecting the second circuit layer and the fourth circuit layer is formed in the third dielectric layer.

In some embodiments, a solder mask is formed on the second circuit layer and the third circuit layer, or a solder mask is formed on the second circuit layer and the fourth circuit layer.

In some embodiments, the first, second, and third dielectric layers are formed by laminating an insulating material comprising benzocyclobutene resin, polyphenylene ether, polyimide, or epoxy resin.

Another aspect of the present invention relates to a method of manufacturing a connector implementing multifaceted interconnection, which comprises the following steps:

a) preparing a temporary bearing plate coated with copper on either side;

b) forming a first copper pillar layer and a sacrificial copper pillar layer on the surface of the temporary bearing plate;

c) applying an etch stop layer on the side face of the sacrificial copper pillar layer and electroplating to form a second copper pillar layer;

d) laminating insulating materials to form a first dielectric layer;

e) forming a first circuit layer on the first dielectric layer;

f) extending a second copper pillar layer and a sacrificial copper pillar layer on the first circuit layer along a height direction, and forming a sacrificial copper layer on the first circuit layer;

g) laminating an insulating material on the first circuit layer to form a second dielectric layer;

h) removing a temporary bearing plate;

i) simultaneously forming a second circuit layer and a third circuit layer on the first dielectric layer and the second dielectric layer;

j) etching the sacrificial copper layer and the sacrificial copper pillar layer away.

Preferably, the temporary bearing plate comprises a temporary bearing plate having a double-layered copper foil laminated on either side.

In some embodiments, step b comprises:
applying an etch stop layer on the temporary bearing plate;
applying a first photoresist layer on the etch stop layer;
patterning the first photoresist layer to form a first pattern;
electroplating to form a first copper pillar layer and a sacrificial copper pillar layer in the first pattern; and
removing the first photoresist layer.

In some embodiments, step c comprises:
applying a second photoresist layer on the first copper pillar layer and the sacrificial copper pillar layer;
patterning the second photoresist layer to form a second pattern exposing either side of the sacrificial copper pillar layer;
applying the etch stop layer on either side of the sacrificial copper pillar layer;
electroplating on the etch stop layer to form a second copper pillar layer; and
removing the second photoresist layer.

In some embodiments, step d comprises:
laminating insulating materials on the first copper pillar layer, the second copper pillar layer and the sacrificial copper pillar layer to form a first dielectric layer; and
thinning the first dielectric layer to expose the first copper pillar layer, the second copper pillar layer and the sacrificial copper pillar layer.

In some embodiments, step e comprises:
applying a first seed layer on the first dielectric layer;
applying a third photoresist layer on the first seed layer;
patterning the third photoresist layer to form a third pattern;
electroplating copper in the third pattern to form a first circuit layer; and
removing the third photoresist layer.

In some embodiments, step f comprises:
extending the second copper pillar layer in a height direction;
applying a fourth photoresist layer on the first circuit layer and the second copper pillar layer;
patterning the fourth photoresist layer to form a fourth pattern so as to expose the side faces of the first circuit layer and the second copper pillar layer;
plating an etch stop layer on the first circuit layer and the side face of the second copper pillar layer;
electroplating copper on the etch stop layer to form a sacrificial copper layer on the first circuit layer, and extending the sacrificial copper pillar layer in the height direction; and
removing the fourth photoresist layer.

In some embodiments, step g comprises:
laminating insulating materials on the first circuit layer, the second copper pillar layer, the sacrificial copper layer and the sacrificial copper pillar layer to form a second dielectric layer; and
thinning the second dielectric layer to expose the second copper pillar layer, the sacrificial copper layer and the sacrificial copper pillar layer.

In some embodiments, step i comprises:
applying a protective film on the second dielectric layer;
etching the etch stop layer on the first dielectric layer; and
removing the protective film;
applying a second seed layer on the first dielectric layer and the second dielectric layer;
applying a fifth photoresist layer on the second seed layer;
patterning a fifth photoresist layer to form a fifth pattern;
electroplating copper in the fifth pattern to form a second circuit layer on the first dielectric layer and a third circuit layer on the second dielectric layer; and
removing the fifth photoresist layer.

In some embodiments, step j comprises:
forming a solder mask on the second circuit layer and the third circuit layer;
applying a protective film on the solder mask;
etching a sacrificial copper layer and a sacrificial copper pillar layer; and
removing the protective film.

Preferably, there is further included performing a surface metal treatment on the exposed metal surface to form a protective layer.

In some embodiments, there is further included between steps i and j the following steps:
extending the second copper pillar layer in a height direction;

forming a sacrificial copper layer and a sacrificial copper pillar layer extending in the height direction on the second circuit layer;

laminating a third dielectric layer on the second circuit layer; and forming a third copper pillar layer and a fourth circuit layer in the third dielectric layer, so that the second circuit layer and the fourth circuit layer are communicated through the third copper pillar layer.

In some embodiments, step j further comprises:

forming a solder mask on the third circuit layer and the fourth circuit layer;

applying a protective film on the solder mask;

etching a sacrificial copper layer and a sacrificial copper pillar layer; and removing the protective film.

BRIEF DESCRIPTION OF THE DRAWINGS

For a better understanding of the invention and to show embodiments thereof, reference is now made, purely by way of example, to the accompanying drawings.

With specific reference to the drawings in particular, it is stressed that the particulars shown are by way of example and for purposes of illustrative discussion of the preferred embodiments of the invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description with reference to the drawings will enable a person skilled in the art to recognize how the several forms of the invention may be embodied in practice. In the drawings.

DETAILED DESCRIPTION OF THE EMBODIMENTS

Figure 1A:
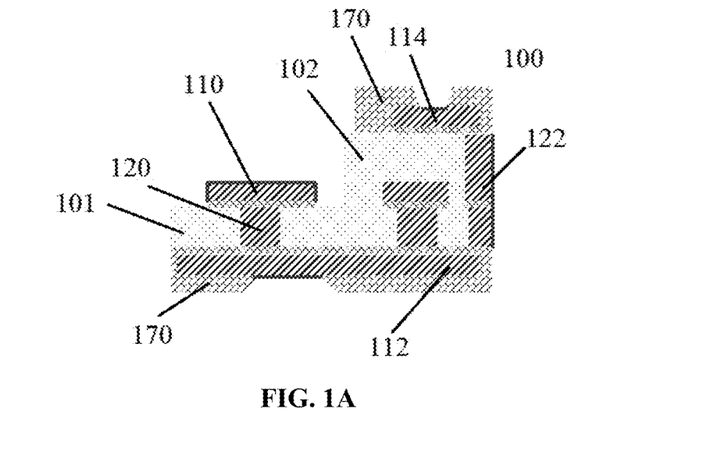
FIGS. 1A-1C illustrate a schematic diagram of a connector implementing a multi-faceted interconnection according to one embodiment of the present invention.

Referring to FIG. 1A, a cross-sectional view of a connector 100 implementing a multi-faceted interconnection is shown. The connector 100 includes: a first dielectric layer 101 between a first circuit layer 110 and a second circuit layer 112; a first copper pillar layer 120 connecting the first circuit layer 110 and the second circuit layer 112 in the first dielectric layer 101; a second dielectric layer 102 on the first circuit layer 110; a third circuit layer 114 on the second dielectric layer 102; and a vertical second copper pillar layer 122 connecting the third circuit layer 114, wherein an opening is formed in the second dielectric layer 102 to expose the first circuit layer 110, and the second copper pillar layer 122 is exposed to the side faces of the side end faces of the first dielectric layer 101 and the second dielectric layer 102. A solder mask 170 is formed on the second circuit layer 112 and the third circuit layer 114. The connector 100 may be side-electrically connected through a second copper pillar layer 122 with exposed side faces, the openings on the solder mask 170 may be connected to a PCB board, and the exposed surfaces on the first circuit layer 110 may be attached to chips or devices to achieve multi-faceted interconnection on the upper and lower sides and side faces.

Figure 1B:
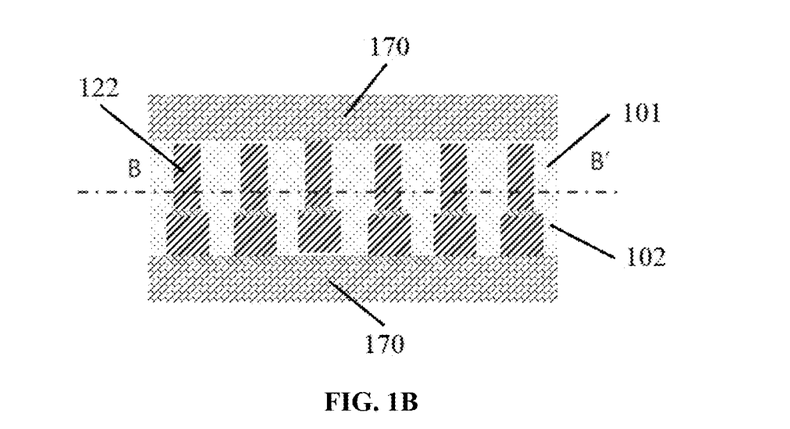

FIG. 1B is a side view of FIG. 1A showing the exposed sides of the second copper pillar layer 122 for side electrical connection on the side end faces of the connector 100.

Figure 1C:
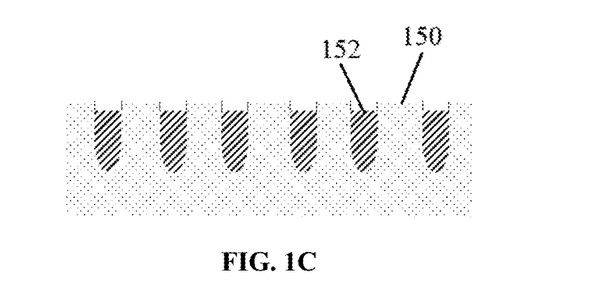

FIG. 1C is a sectional view taken along line B-B' of FIG. 1B. The exposed side 152 of the second copper pillar layer 122 is lower, preferably about 13-30 microns lower, than the side end face 150 of the dielectric layer of the connector 100. This height difference can prevent a short circuit caused by solder during package soldering; if the connection is in direct insertion type, the height of the elastic sheet can also be used as the height of the elastic sheet so as to prevent the connection from dislocation and falling off.

Figure 1D:
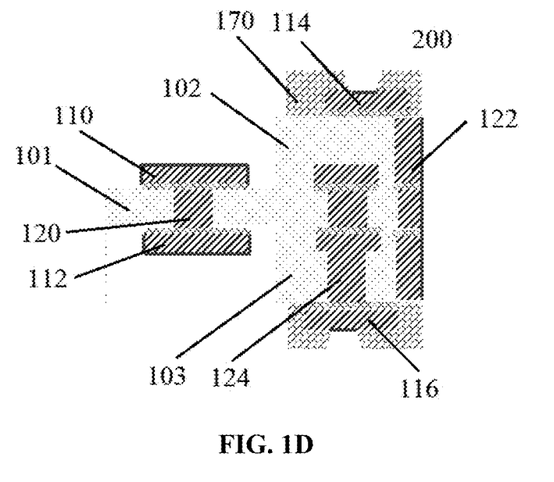
FIGS. 1D-1E show schematic views of a connector implementing a multi-faceted interconnection according to another embodiment of the present invention.

FIG. 1D shows a cross-sectional view of a connector 200 implementing a multi-faceted interconnection. The connector 200 is similar to the connector 100 except that a third dielectric layer 103 and a fourth circuit layer 116 are also formed below the second circuit layer 112, and an opening is formed in the third dielectric layer 103 to expose the second circuit layer 112. A third copper pillar layer 124 connecting the second circuit layer and the fourth circuit layer is formed in the third dielectric layer 103. A solder mask 170 is formed on the second circuit layer 112 and the fourth circuit layer 116. By mounting the devices on the surfaces of the first and second circuit layers 110 and 112, making side electrical connections on the sides of the second copper pillar layer 122, and connecting the PCB boards through the openings of the solder mask 170, upper and lower device stack interconnections and side electrical connections can be achieved.

Figure 1E:
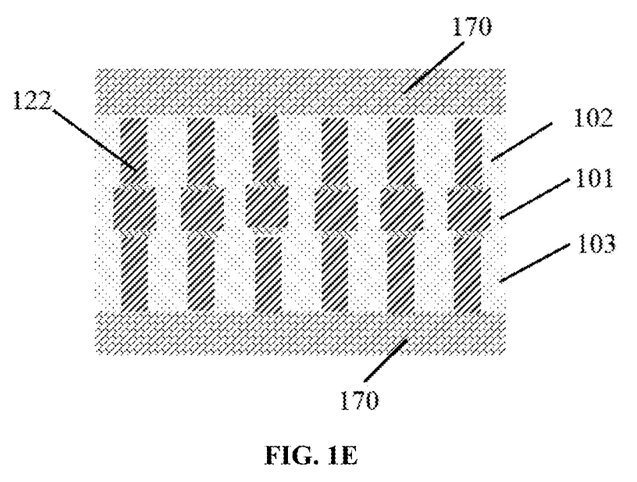

FIG. 1E shows a side view of FIG. 1D. A second copper pillar layer 122 extends through the first, second and third dielectric layers 101, 102, 103 and is electrically connected to the third circuit layer 114.

The first, second and third dielectric layers 101, 102, 103 are formed by laminating insulating materials including benzocyclobutene resin, polyphenylene oxide, polyimide or epoxy resin.

Figure 2A:
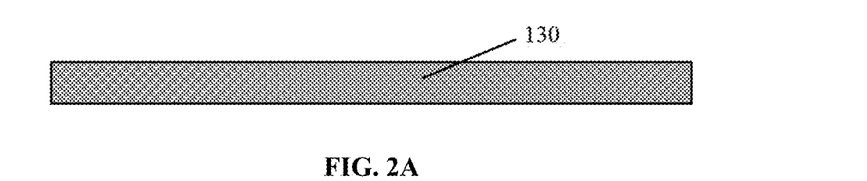
FIGS. 2A-2W show schematic cross-sectional views of intermediate structures at various steps of a method of manufacturing a connector implementing a faceted interconnect of the present invention.
Figure 2B:
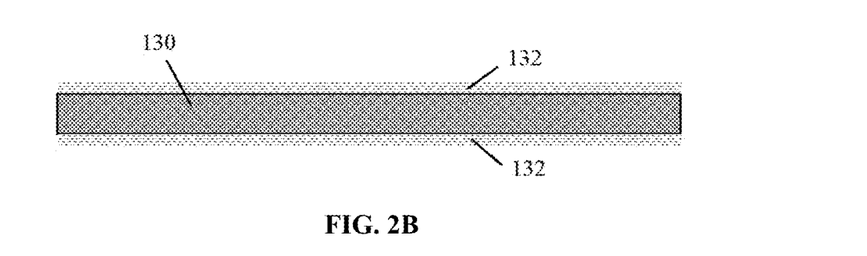
Figure 2C:
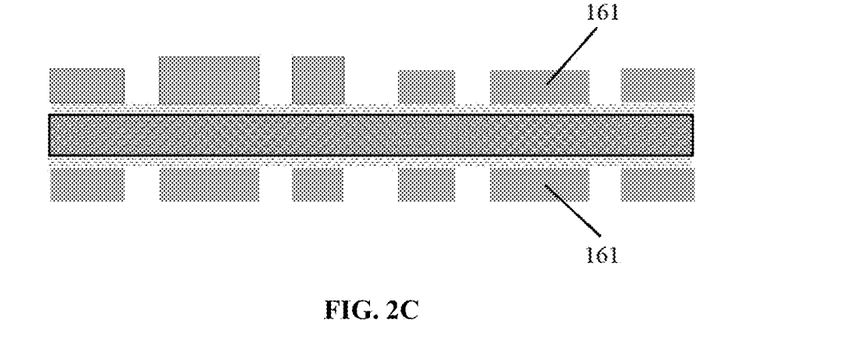
Figure 2D:
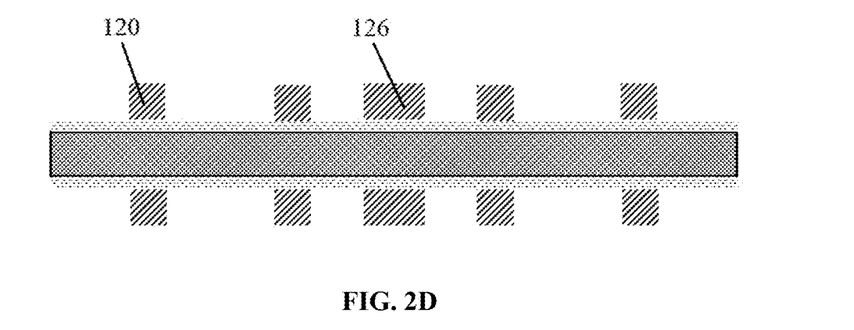
Figure 2E:
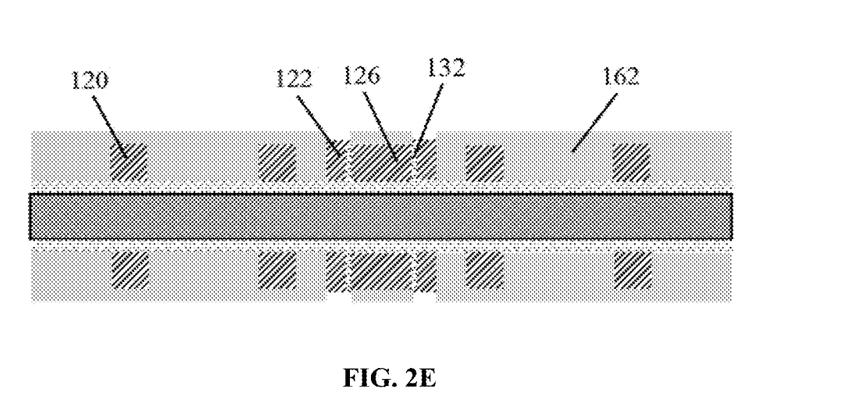
Figure 2F:
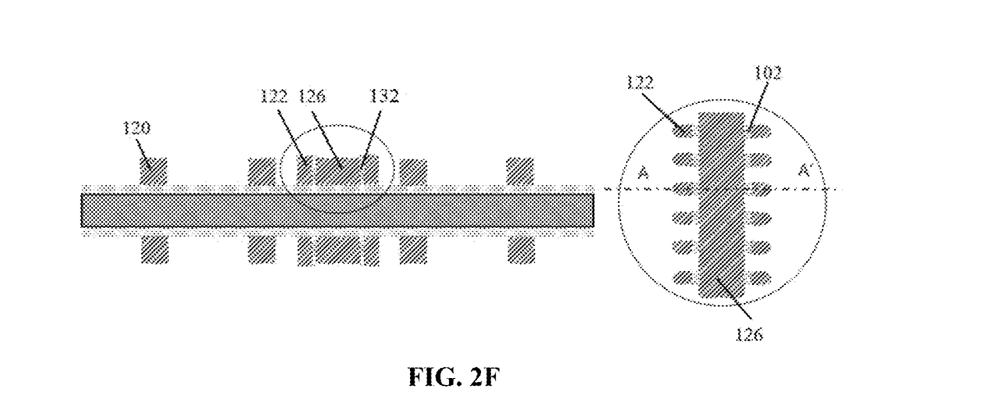
Figure 2G:
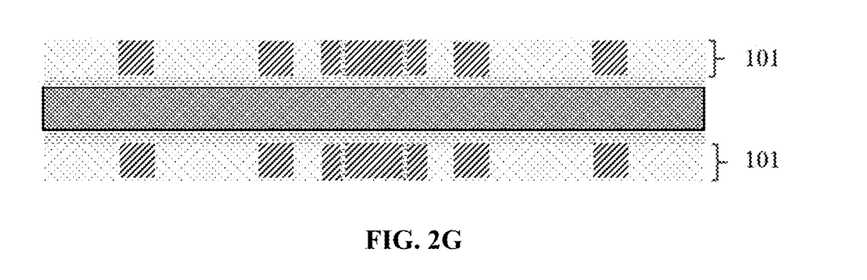
Figure 2H:
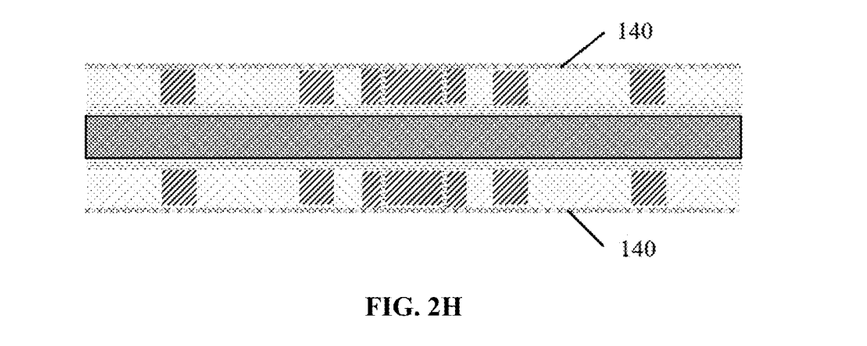
Figure 2I:
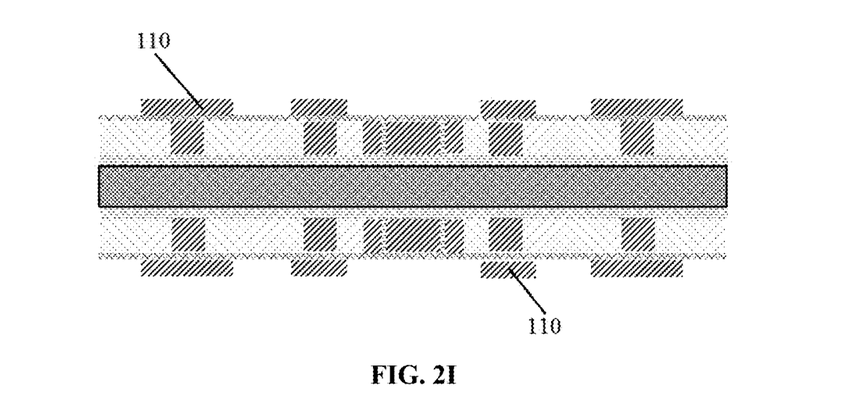
Figure 2J:
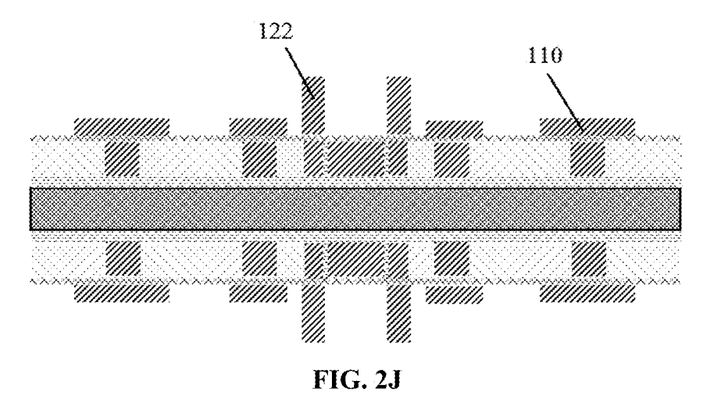
Figure 2K:
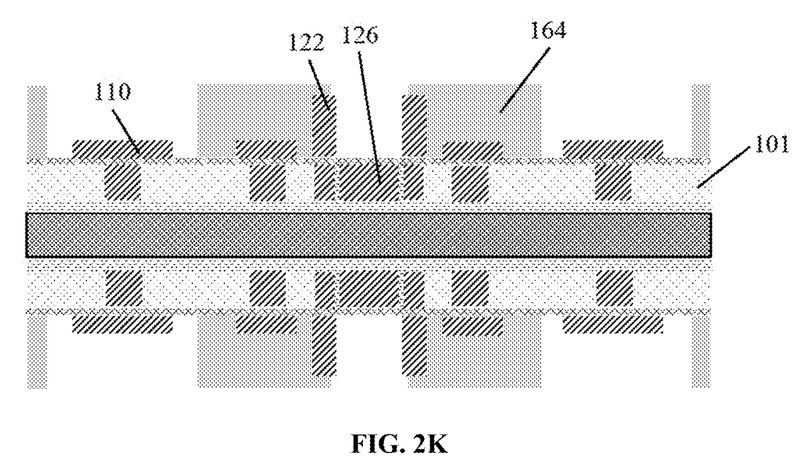
Figure 2L:
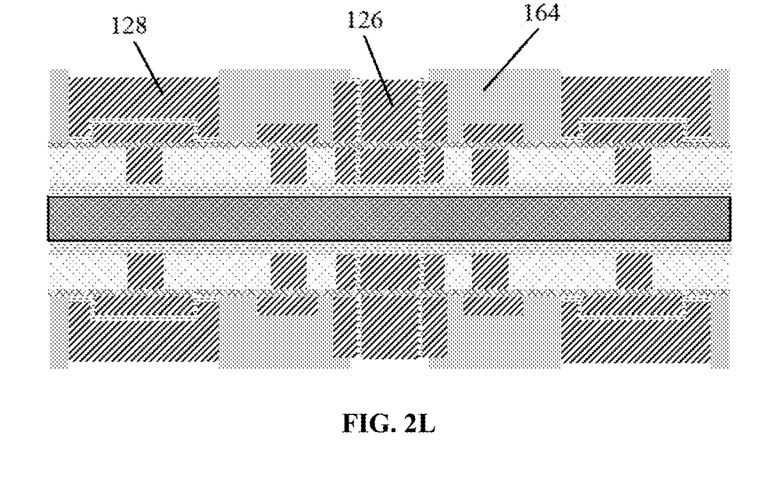
Figure 2M:
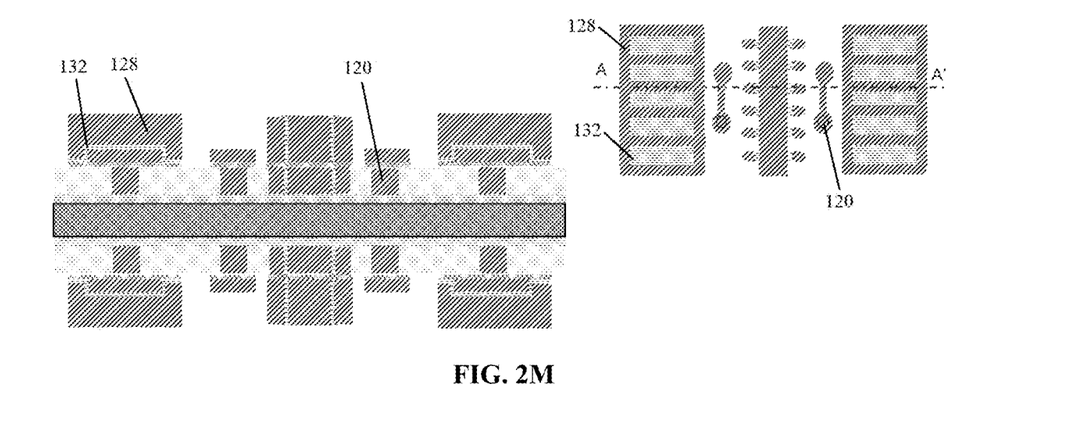
Figure 2N:
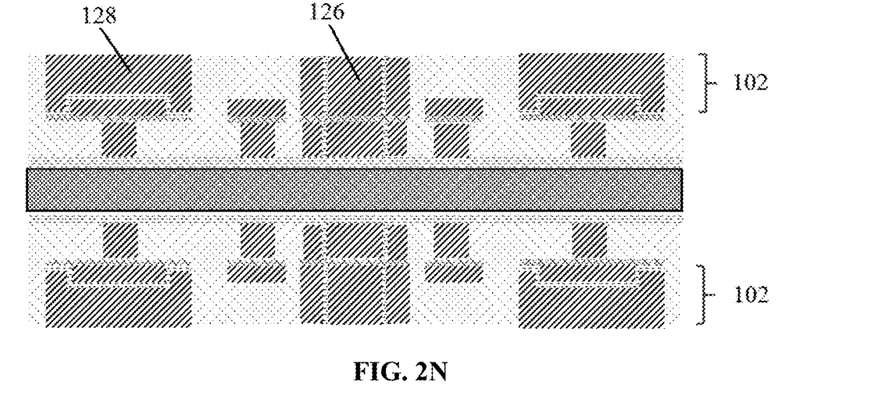
Figure 2O:
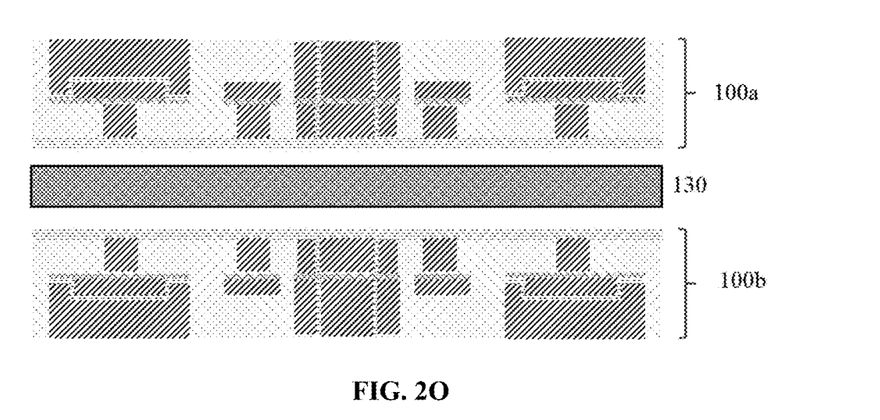
Figure 2P:
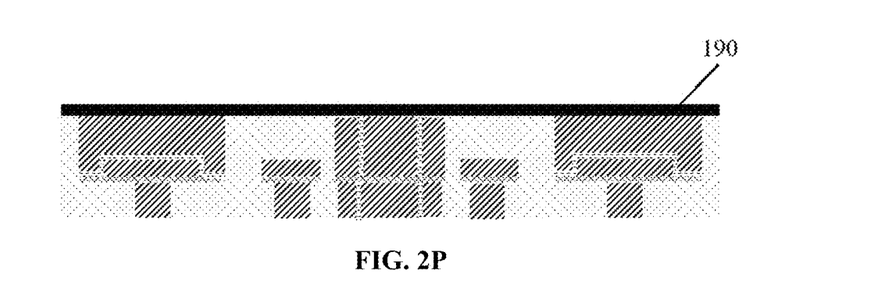
Figure 2Q:
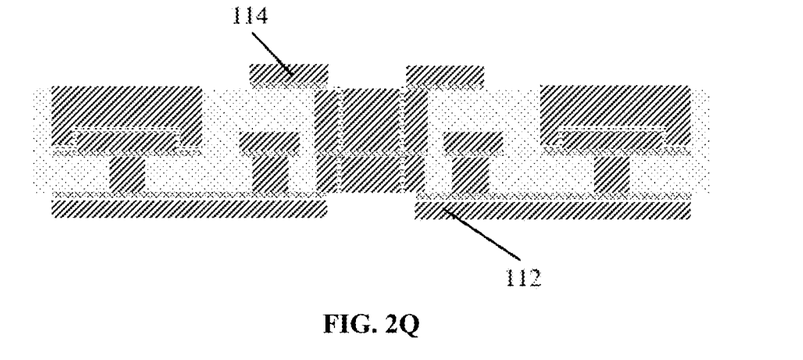
Figure 2R:
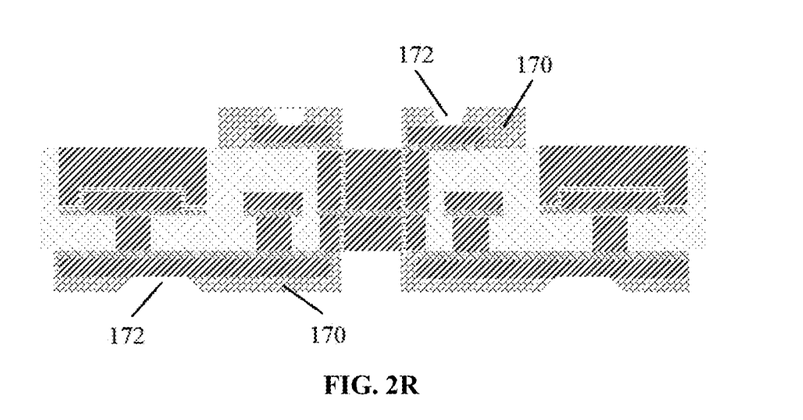
Figure 2S:
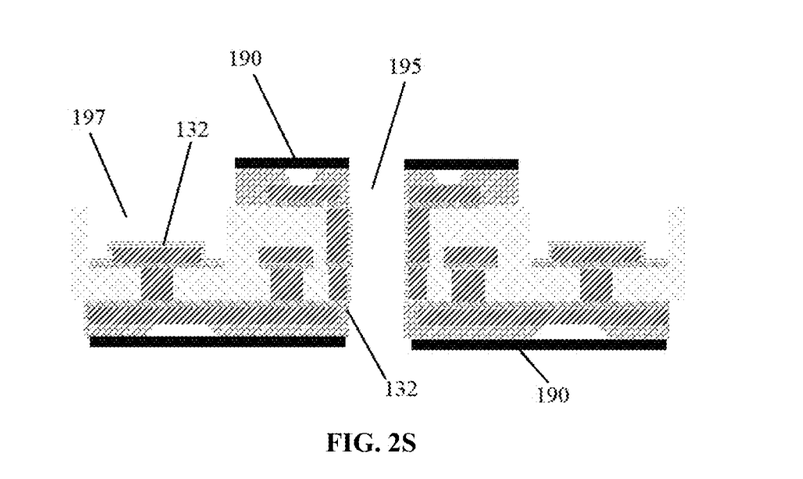
Figure 2T:
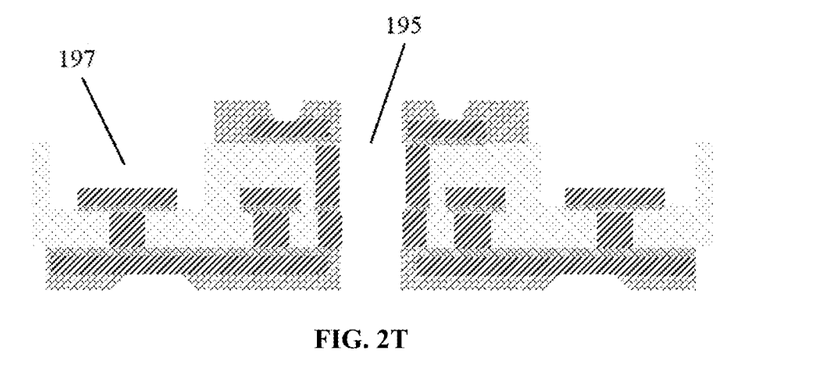
Figure 2U:
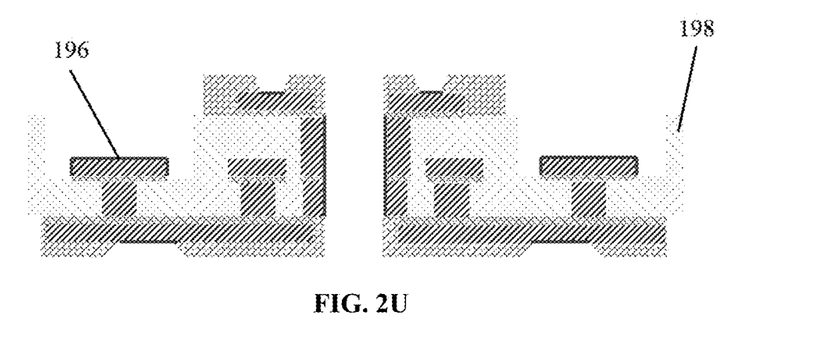
Figure 2V:
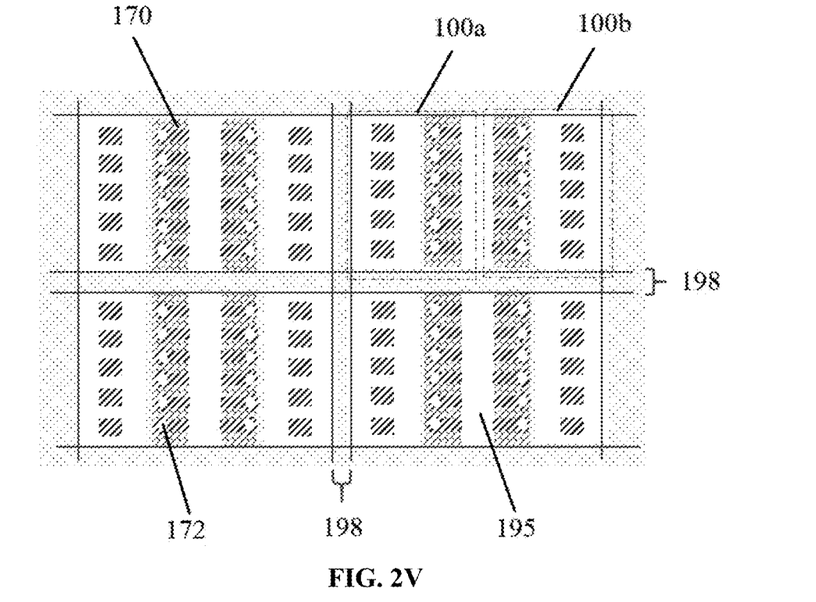
Figure 2W:
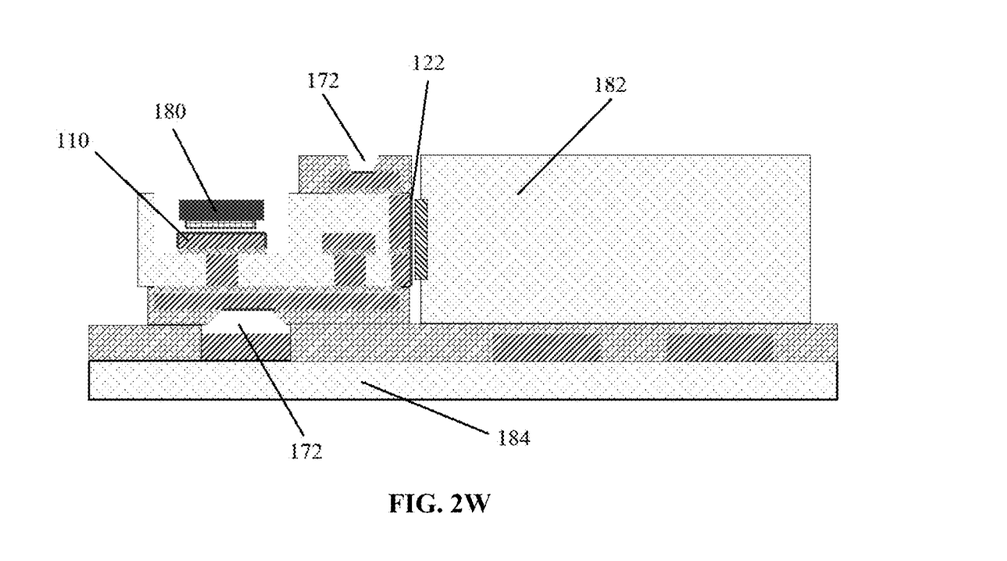

FIGS. 2A-2W show schematic cross-sectional views of intermediate structures at various steps of a method of manufacturing a connector implementing a faceted interconnect of the present invention.

As shown in FIG. 2A, a temporary bearing plate 130 is prepared, which may be a rigid plate of a copper metal surface, such as a copper plate or a copper-clad plate of a certain thickness, preferably an organic plate having double-layered copper foils laminated on either side, such as an epoxy resin plate with double-layer copper foils laminated on the upper surface and the lower surface (the copper foil has a thickness of 3 microns/18 microns, the copper foil having a thickness of 18 microns is close to the inside of the bearing plate, and the copper foil having a thickness of 3 microns is exposed on the outer surface of the temporary bearing plate), no gap and no bonding force exist between the double-layer copper foils on the surface of the epoxy resin plate, and only the epoxy resin plates are physically laminated together. The copper-clad plate is low in cost, layers can be simultaneously added from the upper surface and the lower surface of the temporary bearing plate, the productivity is improved by one time, the plate is lighter, the plate is easier to separate, and the manufacturing process operation is facilitated.

In the following processes, layers are simultaneously added from either side of a temporary bearing plate and are designed the same on either side, and the figures are not repeated for the same elements on either side.

As shown in FIG. 2B, an etch stop layer 132 is applied on either side of the temporary bearing plate 130. An etch stop layer refers to a material that cannot be etched by a copper etchant, but can be etched by other etchants, typically including nickel, titanium, tin, gold, nickel copper, titanium copper, nickel gold, and the like. As a specific example, the etch stop layer may be nickel copper, wherein the nickel layer has a thickness of about 3-10 microns and the copper layer has a thickness of about 10-20 microns.

As shown in FIG. 2C, a first photoresist layer 161 is applied over the etch stop layer 132, which is patterned to form a first pattern exposing the copper pillar locations.

Next, as shown in FIG. 2D, copper is electroplated in a first pattern to form a first copper pillar layer 120 and a sacrificial copper pillar layer 126, and then the first photoresist layer 161 is stripped off. Here, the first copper pillar layer 120 serves as a via stud layer for interlayer conduction in the final product, and the sacrificial copper pillar layer 126 will be etched away. A photosensitive dry film can be used for the photoresist layer, and the photoresist layer can be easily removed through a stripping agent. After the first photoresist layer 161 is removed, all sides of the first copper pillar layer 120 and the sacrificial copper pillar layer 126 are exposed.

As shown in FIG. 2E, a second photoresist layer 162 is applied on the first copper pillar layer 120 and the sacrificial copper pillar layer 126, the second photoresist layer 162 is patterned to form a second pattern to expose either side of the sacrificial copper pillar layer 126 and the second copper pillar layer 122 for side conduction, and the top surface of the sacrificial copper pillar layer 126 is also covered by the second photoresist layer 162. An etch stop layer 132 (approximately 5-20 microns thick) is applied to either side of the sacrificial copper pillar layer 126 and a second copper pillar layer 122 is electroplated over an etch stop layer 132.

As shown in FIG. 2F, the left view is a sectional view taken from line A-A' of the right view, and the left view shows a sectional view after the second photoresist layer 162 is removed; the right view shows an enlarged top view of the middle circled area of the left figure. It can be seen that an etch stop layer 132 is formed between the second copper pillar layer 122 and the sacrificial copper pillar layer 126, thereby preventing the second copper pillar layer 122 from also being etched when etching the sacrificial copper pillar layer 126.

As shown in FIG. 2G, an insulating material including benzocyclobutene resin (BCB), polyphenylene oxide (PPO), polyimide (PI) or epoxy resin (PP) and the like is laminated on the surface of the temporary bearing plate 130; the cured insulating material is thinned to expose the top surface of each copper pillar layer, thereby forming a first dielectric layer 101 having a thickness of about 20-150 microns. The thinning may be achieved by mechanical grinding or gas etching, and as a specific example, the thinning may be achieved by ceramic brush grinding.

As shown in FIG. 2H, a first seed layer 140 is formed on the first dielectric layer 101. The seed layer is typically applied by physical sputtering. The metal seed layer typically contains at least one of titanium, nickel, vanadium, copper, aluminum, tungsten, chromium, silver, gold, and alloys thereof. As a specific embodiment, titanium copper may be used as the first seed layer 101.

As shown in FIG. 2I, a first circuit layer 110 is formed on a first seed layer 140. The method specifically comprises the following substeps: applying a third photoresist layer (not shown) on the first seed layer 140; patterning the third photoresist layer to form a third pattern; electroplating copper in the third pattern to form a first circuit layer 110; and removing the third photoresist layer.

As shown in FIG. 2J, a second copper pillar layer 122 extends in the height direction at the position of the second copper pillar layer 122 on the first circuit layer 110. The extension of the second copper pillar layer 122 may be made using a photolithographic copper fill process.

As shown in FIG. 2K, a fourth photoresist layer 164 is applied over the second copper pillar layer 122, and the fourth photoresist layer 164 is patterned to form a fourth pattern, wherein the fourth photoresist layer 164 covers the top and outer sides of the second copper pillar layer 122 and exposes the top surfaces of the first circuit layer 110 and the sacrificial copper pillar layer 126.

As shown in FIG. 2L, an etch stop layer 132 is electroplated on the surface of the first circuit layer 110 and the side of the second copper pillar layer 122, followed by copper plating in a fourth pattern to form a sacrificial copper layer 128 on the first circuit layer 110 and fill the extended sacrificial copper pillar layer 126 in a height direction such that the top surface of the sacrificial copper pillar layer 126 is substantially flush with the top surface of the second copper pillar layer 122. The etch stop layer 132 typically contains nickel, titanium, tin, gold, nickel copper, titanium copper, nickel gold, and the like, and may be, for example, nickel copper, wherein the nickel layer has a thickness of about 3-10 microns and the copper layer has a thickness of about 10-20 microns.

As shown in FIG. 2M, a cross-sectional view and a top view after removing the fourth photoresist layer 164 and the exposed first seed layer 140 are shown. The right view is a top view of the structure and the left view is a cross-sectional view of the right view taken along line A-A'.

As shown in FIG. 2N, an insulating material including benzocyclobutene resin (BCB), polyphenylene oxide (PPO), polyimide (PI) or epoxy resin (PP) and the like is laminated on the surface of the temporary bearing plate 130 is laminated and filled on the structure shown in FIG. 2M, the cured insulating material is thinned to expose the top surface of each copper pillar layer, thereby forming a first dielectric layer 102 having a thickness of about 30-200 microns. The thinning may be achieved by mechanical grinding or plasma gas etching, and as a specific example, the thinning may be achieved by ceramic brush grinding.

As shown in FIG. 2O, a splitting operation is performed to remove the temporary bearing plate 130 so that either side of the bearing plate becomes two identical connector structures 100*a* and 100*b*. When the temporary bearing plate of double-sided laminated double-layered copper foil is used, the temporary bearing plate 130 can be removed by simply separating the double-layered copper foil. Subsequent processing is illustrated by structure 100*a* on one side.

As shown in FIG. 2P, a protective film 190 is attached to the exposed metal surface of the second dielectric layer 102 to prevent the etchant from damaging the metal surface of the second dielectric layer 102. The protective film 190 may be an etch resistant tape, a photoresist after front exposure, or the like. Next, the etch stop layer 132 is etched away.

As shown in FIG. 2Q, a second circuit layer 112 and a third circuit layer 114 may be formed on outer surfaces of the first dielectric layer 101 and the second dielectric layer 102 in a manner similar to that of FIGS. 2H and 2I, wherein the second circuit layer 112 and the first circuit layer 110 may be conductively connected through a first copper pillar layer 120, and the third circuit layer 114 may be conductively connected with a second copper pillar layer 126.

As shown in FIG. 2R, a solder mask 170 is applied to the second circuit layer 112 and the third circuit layer 114, and a solder resist material such as, but not limited to, AUS 308 or AUS 410 may be surface screen printed or surface mounted. It is also possible to expose and develop the solder mask 170 by applying photoresist, and to open a specific solder opening 172 on the solder mask 170 for electrical connection of the connector 100 on the upper and lower surfaces.

As shown in FIG. 2S, a protective film 190 is attached to the solder mask 170 on the second circuit layer 112 and the third circuit layer 114; then the sacrificial copper pillar layer 126 and the sacrificial copper layer 128 on the first circuit layer 110 are etched, wherein after the sacrificial copper pillar layer 126 is etched, a slot 195 separating two connector units is formed, the two units can be the same or different, and the etch stop layer 132 on one side face of the second copper pillar layer 122 is exposed; after the sacrificial copper layer 128 is etched, an opening 197 is formed in the first circuit layer 110 to expose the etch stop layer 132 on the first circuit layer 110.

The width of the slot formed by etching the sacrificial copper pillar layer 126 is about 80 microns, even the usual thickness of the cutting blades in the packaging process is about 0.15-0.2 mm, the width of a milling cutter having a conventional size is about 0.8 mm. Obviously, the width of the panel can be saved by using the etching method, and the number of the panel units arranged can be effectively increased.

As shown in FIG. 2T, the protective film is removed, and the exposed etch stop layer 132 is further removed to expose the metal surfaces of the first circuit layer 110 and the second copper pillar layer 122.

As shown in FIG. 2U, a surface treatment is performed on the exposed metal surface to form a protective layer 196. The protective layer 196 may be any one of brown copper surface, OSP (organic solder resist), NiAu, Ni—Pd—Au, but is not limited thereto.

As shown in FIG. 2V, a top view of the final panel is shown. After the sacrificial copper pillar layer 126 is etched away, through-going slots 195 are formed, and the entire panel is connected and supported by insulating material within the scribeline 198. After completion of the final surface treatment process, the panel is cut along the cutting path to form a single connector unit, and cutting may be accomplished using a rotary saw blade or other cutting technique such as a laser.

FIG. 2W shows a practical application example of a connector unit according to an embodiment of the present invention. For example, location of the solder mask opening 172 may be connected to the PCB board 184 or other package by bonding wires or solder balls; the exposed surface of the first circuit layer 110 can be used for welding devices 180 such as chips, capacitors, resistors and the like in a surface mounting manner; and the second copper pillar layer 122 which is conducted on the side face can be directly and laterally connected with other modules 182 through direct insertion type or silver paste welding plastic packaging, such as an LCD/Display module and the like, so that the transmission distance of a circuit is effectively shortened, the space utilization rate is improved, and the side face electric connection can be realized besides the upper surface and the lower surface.

A person skilled in the art will recognize that the invention is not limited to what has been particularly shown and described hereinabove and hereinafter. Furthermore, the scope of the invention is defined by the appended claims, including combinations and subcombinations of the various features described hereinabove, as well as variations and modifications thereof, which would occur to persons skilled in the art upon reading the foregoing description.

In the claims, the terms "comprises", and variations thereof, such as "includes, contains", and the like, mean that the recited elements are included, but generally do not exclude other elements.

What is claimed is:

1. A connector for implementing multi-faceted interconnection, characterized in that the connector comprises:
a first dielectric layer between a first circuit layer and a second circuit layer; a first copper pillar layer connecting the first circuit layer and the second circuit layer in the first dielectric layer; a second dielectric layer on the first circuit layer; a third circuit layer on the second dielectric layer; and a vertical second copper pillar layer connected to the third circuit layer,
wherein an opening is formed in the second dielectric layer to expose the first circuit layer, and the vertical second copper pillar layer exposes side faces facing side end faces of the first dielectric layer and the second dielectric layer,
wherein a third dielectric layer and a fourth circuit layer below the third dielectric layer are also formed below the second circuit layer, and an opening is formed in the third dielectric layer to expose the second circuit layer.

2. The connector for implementing a multi-faceted interconnection as claimed in claim 1, wherein the exposed sides of the vertical second copper pillar layer are 13-30 microns below the side end faces of the first dielectric layer and the second dielectric layer.

3. The connector for implementing the multi-faceted interconnection as claimed in claim 1, wherein a solder mask is formed on the second circuit layer and the third circuit layer.

4. The connector for implementing a multi-faceted interconnection as claimed in claim 1, wherein a solder mask is formed on the second circuit layer and the fourth circuit layer.

5. The connector for implementing multi-faceted interconnection as claimed in claim 1, wherein the first dielectric layer and the second dielectric layer comprise benzocyclobutene resin, polyphenylene ether, polyimide or epoxy resin.

6. The connector for implementing a multi-faceted interconnect as claimed in claim 1, wherein the third dielectric layer comprises benzocyclobutene resin, polyphenylene oxide, polyimide, or epoxy.

* * * * *